US008640065B2

(12) United States Patent
Janssen et al.

(10) Patent No.: US 8,640,065 B2
(45) Date of Patent: Jan. 28, 2014

(54) CIRCUIT VERIFICATION USING COMPUTATIONAL ALGEBRAIC GEOMETRY

(75) Inventors: Gradus (Geert) Janssen, Putnam Valley, NY (US); Luis Lastras-Montano, Cortlandt Manor, NY (US); Alexey Y. Lvov, Congers, NY (US); Viresh Paruthi, Austin, TX (US); Robert Shadowen, Austin, TX (US); Barry M. Trager, Yorktown Heights, NY (US); Shmuel Winograd, Scarsdale, NY (US); Ali El-Zein, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/360,083

(22) Filed: Jan. 27, 2012

(65) Prior Publication Data
US 2013/0198705 A1      Aug. 1, 2013

(51) Int. Cl.
 *G06F 9/455*      (2006.01)
 *G06F 17/50*      (2006.01)
(52) U.S. Cl.
 USPC ............ 716/107; 716/106; 716/111; 716/112
(58) Field of Classification Search
 USPC .................................. 716/106, 107, 111, 112
 See application file for complete search history.

(56) References Cited

U.S. PATENT DOCUMENTS

| | | | |
|---|---|---|---|
| 2006/0075374 A1* | 4/2006 | McElvain | 716/17 |
| 2008/0134115 A1* | 6/2008 | Ly et al. | 716/5 |

OTHER PUBLICATIONS

"PMSat: a parallel version of MiniSAT", by Luis Gil, Paulo Flores, Luis Miguel Silveria, @2008.*
"Formal Verification of Galois Field Multiplier Using Computer Algebra techniques", by Jinpeng Ly, Priyank kalla, VLSI Design (VLSID), 2012 25th International Conference on Date of Conference: Jan. 7-11, 2012, IEEE.*
"Verification of Composite Galois Field Multiplier Over GF((2^m)^n) Using Computer Algebra Technique", by Jinpeng Ly, Priyank Kalla, and Florian Enescu, IEEE @2011.*
Morioka et al., Towards Efficient Verification of Arithmetic Algorithms Over Galois Fiels GF(2m), G. Berry, H. Comon and A. Finkel (Eds.): CAV 2001, LNCS 2102, pp. 465-477, 2001.
Cox et al., "Ideals, Varieties, and Algorithms" An Introduction to Computational Algebraic Geometry and Commutative Algebra, Third Edition, Feb. 14, 2007 pp. 76-77, 82-87.
Lidl et al., "Finitie Fields" Encyclopedia of Mathematics and its Applications, Sep. 1983, pp. 106-125.

* cited by examiner

*Primary Examiner* — Nha Nguyen
(74) *Attorney, Agent, or Firm* — Harrington & Smith

(57) ABSTRACT

In one exemplary embodiment of the invention, a method includes: receiving a first description for a circuit whose operation over a plurality of inputs is to be verified; receiving a second description for expected behavior of the circuit, where the expected behavior in the second description is expressed as a set of algebraic systems of multivariable polynomials over at least one Galois field; applying at least one computational algebraic geometry technique to a combination of the first description and the second description to determine whether the circuit is verified, where verification of the circuit confirms that at least one output obtained based on the first description corresponds to at least one expected value based on the expected behavior expressed in the second description; and outputting an indication as to whether the circuit is verified.

22 Claims, 10 Drawing Sheets

```
BEGIN Do not edit this section ### alias "bv"="/abc/home/def/BV/bv"
alias "detach_test"="/abc/home/BV/detach_test"

# --------- Blueveri source directory. --------- #
export BV_SOURCE_DIR=\
/abc/home/BV

# --------- 'executable_verify' file with full path --------- #
export BV_EXECUTABLE_VERIFY=\
/abc/home/BV/executable_verify

# --------- Full path to MESA --------- #
export BLUEVERI_MESA_PATH=\
/abc/texsim/13.1/bin

# --------- MESA settings --------- #
export SIMIN=\
$BV_MESA_PATH:/abc/texsim/13.1

# --------- DADB settings --------- #
export DBIN=\
/abc/home/BV:\
/abc/vlsi/tools/simarama/next:\
/abc/vlsi/tools/simarama/latest

# --------- Grobner engine type. --------- #
export BV_GROBNER_ENGINE_NAME=\
singular   # 'mathematica', 'singular', 'fake_grobner_engine'.

# --------- 'GROBNER_ENGINE' executable with full path. --------- #
export BV_GROBNER_ENGINE=\
/abc/home/BV/SINGULAR_AIX/Singular/2-0-3/AIX-4/singular

# --------- This directory is copied in full when detaching a test. --------- #
export BV_LINUX_GROBNER_ENGINE_DIR=\
/abc/home/BV/SINGULAR_LINUX/Singular

END Do not edit this section ###
```

FIG. 2A

```
# ---------- This file with full path. ---------- #
export BV_FILE=\
/abc/home/BV/tests_mbs_gf256lib.bv

# ---------- List of directories (full paths) to all .VHDL files ---------- #
export VHDLPATH=\
/abc/home/BV/VHDL_DIR

# ---------- Directory (full path) for '.chk' files. ---------- #
export BV_CHK_DIR=\
/abc/home/BV/CHK_DIR

# ---------- Directory (full path) for all temporary files. ---------- #
export BV_TEMPORARY_DIR=\
/abc/home/BV/TEMP_OUT_DIR

# ---------- The rest of the file is not a shell script. ---------- #
# ----------      It is to be read by BV.      ---------- #
: <<'END_OF_LARGE_COMMENTED_BLOCK' # Begin large block comment.

Section 1.
   ------------
Multiplication functions.

@                      Multiplication:   8  8 GFMULT
@ End of section.

Section 2.
   ------------
Field embeddings.

@ End of section.
```

FIG. 2B

```
  Section 3.
  -------------
All GF addition functions.

@                        Addition:   8  8 GFADD
@ End of section.

Section 4.
  -------------
All GF division functions.
Note: In BV the result of division
by zero is by definition zero.

@                        Division:   8  8 GFDIV
@ End of section.

Section 5.
  -------------
All GF inverse (1/x) functions.
Note: In BV the result of division
by zero is by definition zero.

@           Taking mutliplicative inverse:   8 GFINV
@ End of section.

Section 6.
  -------------
All GF `WHEN ... ELSE' functions.
When bit_arg1 is TRUE return arg2
else             return atr3

@                   GF 'WHEN ... ELSE':   8 WHEN_ELSE
@ End of section.
```

FIG. 2C

Section 7.
----------
List of 0 or more linear functions.
They will be automatically recognized.
Format:
log2(order of domain)
log2(order of codomain)
FUNCTION_NAME @ List of linear functions           :
                              8 8 GFSQUARE
                              8 8 EXTRACT_HIGH_NIBBLE
                              8 8 EXTRACT_LOW_NIBBLE
@ End list of linear functions       :

Section 8.
----------
GF 'Is_zero' functions.

@    Test if GF element is always equal to 0:   8 IS_ZERO
@ End of section.

Section 9.
----------
GF 'Is_nonzero' functions.

@    Test if GF element is always not equal to 0:   8 IS_NONZERO
@ End of section.

FIG. 2D

```
  Section 10.
  --------------
  Bit functions.
  In BV it is allowed, but not
  recommended to use bit operators
  'NOT', 'AND', 'OR', 'XOR'.
  You can replace '-' by name of the
  wrapping function. It is not allowed to
  use bit 'WHEN ... ELSE' operator.

@                           NOT: -
  @                           AND:  QUACK_QUACK
  @                           OR: -
  @                           XOR: -
  @                    WHEN ... ELSE:  BOOL_WHEN_ELSE

Section 11.
  --------------
  List of all defined fields in any order.
  The fields must form a tower.

@                        field:   8 GF
  @ End of section.

Section 12.
  -------------
  The header to be included in .VHDL
  which enables all the above functions.

@ Header                    :
                              library ieee;
                              use ieee.std_logic_1164.all;
                              use work.mbs_gf256lib.all;
  @ End header                :

END_OF_LARGE_COMMENTED_BLOCK
```

FIG. 2E

BEGIN_RESOURCE_LIMITS {Max. time per one Grobner basis computation in centiseconds, max. number of terms in a polynomial};
  50 5000;
  500 50000;
END_RESOURCE_LIMITS;

MESSAGE_LEVEL 2 {0 - final result only, 1 - minimal, 2 - verbose, 3 - verbose with i/o of Grobner engine};

PROVE_ALGEBRAIC_SYSTEMS_UNSATISFIABILITY_OVER 0 {0 - correct domains, 1 - algebraic closure, 2 - First a.c. if fails c.d.};

BEGIN_CHECK;

NAME two_errors_check_1_0 {Name can consist of any ASCII [33...126] characters};

BEGIN_IN_BITS_SETTINGS;
  END_IN_BITS_SETTINGS;

BEGIN_EXPLICIT_EXPRESSIONS_FOR_SOME_GF_INPUTS;
    TEST_ERRORS_IN(3) <= 3"0";
    TEST_ERRORS_IN(4) <= 3"0";
    TEST_ERRORS_IN(5) <= 3"0";
    TEST_ERRORS_IN(6) <= 3"0";
    TEST_ERRORS_IN(7) <= 3"0";
    TEST_ERRORS_IN(8) <= 3"0";
    TEST_ERRORS_IN(9) <= 3"0";
    TEST_ERRORS_IN(10) <= 3"0";
    TEST_ERRORS_IN(11) <= 3"0";
    TEST_ERRORS_IN(12) <= 3"0";
    TEST_ERRORS_IN(13) <= 3"0";
    TEST_ERRORS_IN(14) <= 3"0";
    TEST_ERRORS_IN(15) <= 3"0";
  END_EXPLICIT_EXPRESSIONS_FOR_SOME_GF_INPUTS;

BEGIN_ALGEBRAIC_CONSTRAINTS_ON_GF_INPUTS;
    N_ZR TEST_ERRORS_IN(0);
    N_ZR TEST_ERRORS_IN(1);
    N_ZR TEST_ERRORS_IN(2);
    ZERO TEST_ERRORS_IN(0) + TEST_ERRORS_IN(1) + TEST_ERRORS_IN(2);
  END_ALGEBRAIC_CONSTRAINTS_ON_GF_INPUTS;

BEGIN_BIT_EXPECTED_VALUES;
    TEST_UE must be '1';
  END_BIT_EXPECTED_VALUES;

END_CHECK;

FIG. 3

601 — RECEIVING AT LEAST ONE ELECTRONIC FILE COMPRISING A FIRST DESCRIPTION FOR EXPECTED BEHAVIOR OF A CIRCUIT WHOSE OPERATION OVER A PLURALITY OF INPUTS IS TO BE VERIFIED, WHERE THE EXPECTED BEHAVIOR IN THE FIRST DESCRIPTION IS EXPRESSED AS AT LEAST ONE EXPECTED VALUE UNDER A SET OF ALGEBRAIC SYSTEMS OF MULTIVARIABLE POLYNOMIALS, WHERE THE SET OF ALGEBRAIC SYSTEMS COMPRISES AT LEAST ONE OF A FIRST EQUATION AND A SECOND EQUATION, WHERE THE FIRST EQUATION IS IN AT LEAST ONE FIRST VARIABLE OVER AT LEAST ONE FIRST GALOIS FIELD AND IS SET EQUAL TO ZERO, WHERE THE SECOND EQUATION IS IN AT LEAST ONE SECOND VARIABLE OVER AT LEAST ONE SECOND GALOIS FIELD AND IS SET NOT EQUAL TO ZERO, WHERE THE AT LEAST ONE ELECTRONIC FILE FURTHER COMPRISES AT LEAST ONE EXPECTED VALUE OF AT LEAST ONE SIGNAL IN THE CIRCUIT

602 — DETERMINING WHETHER THE CIRCUIT IS VERIFIED BY USING THE FIRST DESCRIPTION FROM THE AT LEAST ONE ELECTRONIC FILE AND A SECOND DESCRIPTION, WHERE THE SECOND DESCRIPTION COMPRISES A DESCRIPTION OF THE CIRCUIT, WHERE VERIFICATION OF THE CIRCUIT CONFIRMS THAT AT LEAST ONE OUTPUT OBTAINED BASED ON THE SECOND DESCRIPTION CORRESPONDS TO THE AT LEAST ONE EXPECTED VALUE EXPRESSED IN THE FIRST DESCRIPTION

FIG. 6

CIRCUIT VERIFICATION USING COMPUTATIONAL ALGEBRAIC GEOMETRY

TECHNICAL FIELD

The exemplary embodiments of this invention relate generally to circuit design for electronic devices and components and, more specifically, relate to circuit verification.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

Usually it is extremely costly or even impossible to fix a bug in a piece of hardware once it is in production. As such, it is very important that circuits are designed "correct by construction." In other words, during the design stage the logic of the circuit must be verified for all possible legal combinations of inputs against the set of conditions characterizing the circuit's expected behavior. Clearly this process becomes increasingly complex as the complexity of the circuit increases. Furthermore, the number of inputs can dramatically affect the processing and time required for circuit verification.

As an example, the simplest way of obtaining complete circuit verification is simulation of the circuit for all possible combinations of inputs. In such a manner, one can verify that all of the outputs obtained (i.e., across all possible combinations of inputs) correctly correspond to the expected behavior and desired function of the circuit. However, when the number of input bits exceeds around 40-50, the amount of computation needed may extend beyond the capability of current computer systems. In addition, this process is tedious and may require an excessive amount of time for computation.

BRIEF SUMMARY

In one exemplary embodiment of the invention, a method comprising: receiving a first description for a circuit whose operation over a plurality of inputs is to be verified; receiving a second description for expected behavior of the circuit, where the expected behavior in the second description is expressed as at least one expected value under a set of algebraic systems of multivariable polynomials over at least one Galois field; applying at least one computational algebraic geometry technique to a combination of the first description and the second description to determine whether the circuit is verified, where verification of the circuit confirms that at least one output obtained based on the first description corresponds to the at least one expected value based on the expected behavior expressed in the second description; and outputting an indication as to whether the circuit is verified.

In another exemplary embodiment of the invention, an apparatus comprising: at least one processor; and at least one memory configured to store computer program instructions, execution of the computer program instructions by the at least one processor resulting in operations comprising: receiving a first description for a circuit whose operation over a plurality of inputs is to be verified; receiving a second description for expected behavior of the circuit, where the expected behavior in the second description is expressed as at least one expected value under a set of algebraic systems of multivariable polynomials over at least one Galois field; applying at least one computational algebraic geometry technique to a combination of the first description and the second description to determine whether the circuit is verified, where verification of the circuit confirms that at least one output obtained based on the first description corresponds to the at least one expected value based on the expected behavior expressed in the second description; and outputting an indication as to whether the circuit is verified.

In a further exemplary embodiment of the invention, a method comprising: receiving at least one electronic file comprising a first description for expected behavior of a circuit whose operation over a plurality of inputs is to be verified, where the expected behavior in the first description is expressed as at least one expected value under a set of algebraic systems of multivariable polynomials, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and determining whether the circuit is verified by using the first description from the at least one electronic file and a second description, where the second description comprises a description of the circuit, where verification of the circuit confirms that at least one output obtained based on the second description corresponds to the at least one expected value expressed in the first description.

In another exemplary embodiment of the invention, an apparatus comprising: an apparatus comprising: at least one processor; and at least one memory configured to store computer program instructions, execution of the computer program instructions by the at least one processor resulting in operations comprising: receiving at least one electronic file comprising a first description for expected behavior of a circuit whose operation over a plurality of inputs is to be verified, where the expected behavior in the first description is expressed as at least one expected value under a set of algebraic systems of multivariable polynomials, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and determining whether the circuit is verified by using the first description from the at least one electronic file and a second description, where the second description comprises a description of the circuit, where verification of the circuit confirms that at least one output obtained based on the second description corresponds to the at least one expected value expressed in the first description.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein:

FIG. 2 shows an exemplary setup file that may be used in conjunction with the exemplary embodiments of the invention;

FIG. 3 depicts an exemplary check script that may be used in conjunction with the exemplary embodiments of the invention;

FIG. 6 depicts a flowchart illustrating another non-limiting example of a method for practicing the exemplary embodiments of the invention.

DETAILED DESCRIPTION

Figure 1:
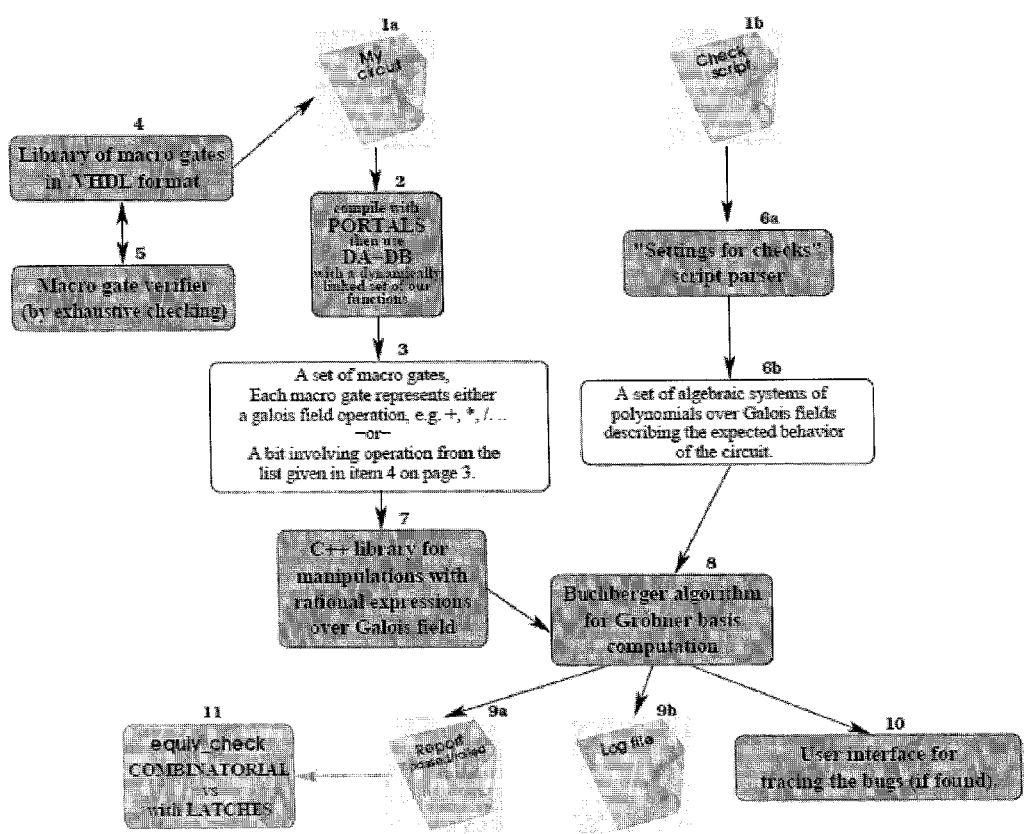
FIG. 1 illustrates one exemplary embodiment of the invention using Gröbner bases in conjunction with Buchberger's algorithm.

Another technique for circuit verification is the random sampling approach. The circuit is verified only for some fixed number N of randomly generated legal inputs. This technique works well under the assumption that the fraction of legal inputs which make the faulty circuit misbehave is well above 1/N. Unfortunately, this rarely occurs in practice. Normally, if there is a bug in a circuit it only reveals itself in "corner cases", that is, in very rare, special situations about which the circuit designer is very likely to forget. For example, the famous Intel's 1994 Pentium Floating Point Division bug only shows up once in 9 billion random FDIV instructions.

Another technique for circuit verification is to reduce the NP-hard problem of complete verification to a better studied NP-hard problem, such as Boolean SAT, for example. If the number of variables (input bits) does not exceed 150-200, the latter (SAT) usually can be solved by using one of numerous heuristics developed over the past 30 years. This approach is one of the most effective of the known complete verification methods in a situation where nothing is known beforehand about the nature of the circuit.

As noted above, the goal is to provide formal verification of an algorithm implementation. This entails exhaustive exploration of all properties of interest in the implementation and may employ symbolic reasoning techniques when exhaustive simulation is not feasible. Nonetheless, even state-of-the-art formal verification tools generally are unable to verify the more complex error correction code (ECC) designs. Such tools operate at the Boolean level and do not exploit specifics of any underlying Galois field arithmetic.

Exemplary embodiments of the invention include a logic circuit specification methodology and a reasoning tool specialized to situations where Goils field arithmetic may be employed. The language has (at least) two basic variable types: a Boolean, and a Galois field element. Relations between these variables are stated using simple semantic rules. The reasoning tool is based on rational expression manipulation and propagation as well as checks of satisfiability of polynomial systems of equations, for example, based on the concept of Gröbner basis and the associated Buchberger algorithm. As noted below, operations may occur between Booleans (e.g., assignment, and, or, not), Galois field elements (e.g., assignment, addition, multiplication, inversion, division, linear mappings), and/or Galois field elements and Booleans (e.g., muxing, zero inquiry). The zero inquiry operation is referred to below as "is_zero."

Exemplary embodiments of the invention enable complete symbolic verification of logical circuits that substantially rely on arithmetic over Galois fields. As an example, most error correcting circuits fall in this category, as well as some of the circuits for data encryption and arithmetic logic unit (ALU).

As a non-limiting example, the exemplary embodiments of the invention are particularly suited for verifying a circuit that has a large number of inputs. For example, using the exemplary embodiments of the invention one can verify a 1024-bit input error correction circuit responsible for communication between a processor and a memory. Because of the large number of inputs, it would be unfeasible to verify such an error correction circuit using the above-noted reduction to SAT (e.g., it may cause conventional verification tools to crash after several days of running).

Various exemplary embodiments of the invention use the fact that Reed-Solomon ECC operates mostly on the elements of finite fields (e.g., Galois fields or "GF"), which, for example, can be represented by 8 bits each. Thus, the input to the circuit, instead of 1024 bits, may comprise 64 elements of GF(256) and a few 1-bit flags (e.g., control bits). All operations on the elements of GF(256) reduce to a number of elementary arithmetic operations over the field, such as addition, multiplication, division and projection on a fixed basis vector, as non-limiting examples. The fact that the circuit is capable of correcting the claimed number of errors expresses in terms of algebraic statements similar to (but larger than) the example below.

EXAMPLE

Circuit C with GF inputs x, y, z (the corrupted 'in' message) and GF outputs a, b, c (the repaired 'out' message) always completely repairs the message if $$\begin{cases} x+y+z = 0, \\ x^3+y^3+z^3 = 0, \end{cases} \Rightarrow a+b^2+c^4 = 0.$$

The process of verification of such circuits reduces to verification of a number of algebraic statements of the type "A certain system of multivariate polynomials over a finite field implies some other system of multivariate polynomials over a finite field." The latter problem relates to computational algebraic geometry and, as a non-limiting example, can be solved by building Gröbner bases for certain sets of polynomials using Buchberger's algorithm (see [1], pp. 77, 82-87).

One of ordinary skill in the art will appreciate the definition for and application of Gröbner bases. Similarly, one of ordinary skill in the art will appreciate the definition for and application of Buchberger's algorithm. As a non-limiting example for both, reference is made to [1] at pp. 77 and 82-87. In addition, there is some further, generalized discussion of Gröbner bases herein. Furthermore, it is briefly noted that while referred to herein as "Gröbner" bases, these items and/or this technique also may be referred to as "Groebner" bases and/or "Grobner" bases.

Mathematically, a circuit model is a graph with directed edges and no loops. An input node is defined as any graph node with no incoming edges. An input node contains exactly one variable which is a Galois field element. An edge has the capability of carrying a Boolean expression or a multivariable rational expression over at least one Galois field. The only variables present in the rational expression are those input variables that are Galois field elements. An internal node is any graph node with at least one incoming edge. Internal nodes are associated with operations such as those noted above (e.g., occurring between Booleans, Galois field elements, and/or Galois field elements and Booleans).

Assume that the input variables are $x_0, \ldots, x_{n-1}$. The function $f(x_0, \ldots, x_{n-1})$ is a vector containing one or more arbitrary polynomial expressions in the input variables. Let $e=\{e_0, \ldots, e_{m-1}\}$ be Boolean variables in the graph and $c=\{c_0, \ldots, c_{m-1}\}\in\{true, false\}^m$ be desired values. A typical theorem (to be proven) is as follows: if the inputs $x_0, \ldots, x_{n-1}$ satisfy $f(x_0, \ldots, x_{n-1})=0$ then in the given circuit one has $e=c$. The reasoning engine applies the rule—any node with incoming edges fully defined evaluates its operation and propagates on its output edge until no such nodes are found.

Next, choose an is_zero with a resolved input but an unresolved output. Assume that the input to the chosen is_zero is the polynomial $p(x_0, x_1, \ldots, x_{n-1})$. Then: if the system of equations $f(x_0, \ldots, x_{n-1})=0, p(x_0, \ldots, x_{n-1})=0$ is unsatisfiable then is_zero=false. Also, if the system of equations $f(x_0, \ldots, x_{n-1})=0, p(x_0, \ldots, x_{n-1})\neq 0$ is unsatisfiable then is_zero=true. This may also be referred to herein as "UNSAT" proving technique(s).

To prove whether a system of equations is unsatisfiable, consider the concept of a reduced Gröbner basis. Let $K[x_0, \ldots, x_{n-1}]$ be the ring of polynomials with variables $x_0, \ldots, x_{n-1}$ and coefficients in $F_q$. Let $\mathcal{F}$ be a set of polynomials in $K[x_0, \ldots, x_{n-1}]$. The ideal generated by $\mathcal{F}$ is defined as:

$$\langle \mathcal{F} \rangle = \{a_1 g_1 + \ldots + a_r g_r : g_i \in \mathcal{F}, a_i \in F_q\} \qquad (1)$$

A Gröbner basis G (relative to some monomial ordering) for the ideal $\langle \mathcal{F} \rangle$ is a subset of $\langle \mathcal{F} \rangle$ satisfying the property that the ideal generated by the leading terms of polynomials in $\langle \mathcal{F} \rangle$ is equal to the ideal generated by the leading terms of G. A reduced Gröbner basis satisfies some additional requirements. Such a basis always exists and is unique.

The variety of $\mathcal{F}$ is defined as the set of zeros in the system of equations implied by $\mathcal{F}$:

$$V(\mathcal{F})=\{(x_0, \ldots, x_{n-1}) \in F_q^n : f(x_0, \ldots, x_{n-1})=0 \text{ for all } f \in \mathcal{F}\} \qquad (2)$$

Assume as before that G is a Gröbner basis for $\langle \mathcal{F} \rangle$. The key attribute of a reduced Gröbner basis (in addition to existence and uniqueness) is that the variety $V(\mathcal{F})$ is empty (that is, the associated system is unsatisfiable) if and only if G=1. Computation of the reduced Gröbner basis may be performed, for example, through Buchberger's algorithm.

As a non-limiting example, a basic algorithm may be as follows.

1. Evaluate the operation of any node with incoming edges fully defined and propagate the results on its output edge until no such nodes are found.
2. Determined whether the edge with the Boolean value to be tested in the circuit has been evaluated to true or false. If so, STOP—the theorem has been proved or disproved.
3. Enumerate all is_zero operations that have a resolved input but do not have a resolved output value, and mark them as "untested".
4. Choose an is_zero that has an "untested" mark.
5. Attempt to prove whether the output of is_zero is true or false by testing whether it is impossible to obtain true or false given the assumptions given for the circuit (here is where Gröbner bases are used, although other UNSAT methods may be applicable).
6. If the attempt succeeds to prove either false or true, propagate the result to the output edge of the is_zero and restart the algorithm from step 1.
7. If the attempt does not succeed, mark the is_zero as "tested" and restart from step 4 by choosing an untested is_zero.
8. If there are no more untested is_zeros and the theorem is not proved yet, pick any of the remaining "tested by not resolved" is_zeros (call it "is_zeroA") and FORK the process into two branches adding to the set of assumptions for the first branch "is_zeroA=false" and for the second branch "is_zeroA=true". Both branches now have fewer unresolved is_zeros than the parent branch. Drop the parent branch and continue to evaluate the first and second branches separately following steps 1-8.
9. Eventually no unevaluated is_zeros will remain in any of the branches. At this pont, the values of all Boolean nodes are known and, thus, the theorem is either proved or proved false by simply looking at the Boolean value of the corresponding node.

An exemplary tool incorporating such an algorithm may include additional extensions and/or optimizations including, as non-limiting examples: a graph tracing tool for analyzing bugs; support for Galois fields built using tower structures (nesting) since heavily optimized Galois field algorithms often exploit subfield operations; automatic discovery of Galois field representation since there are different ways of describing a Galois field; support for linear functions mapping Galois field elements to other Galois field elements (including field conversion within a tower field); and compatibility with the VHDL language.

It should further be noted that for some signals (e.g., Boolean signals), attempting to prove the signal/system "true" is performed by testing whether "false" is unsatisfiable. Similarly, attempting to prove the signal/system "false" may be performed by testing whether "true" is unsatisfiable.

Exemplary embodiments of the invention have been applied to real life error correcting code design. One exemplary graph contained over 100,000 nodes. More than 1,000,000 theorems about the graph were proven, including correctable and uncorrectable scenarios. As a non-limiting example, full simulation of the same space would take more than $2^{1000}$ trials. It takes approximately 2 weeks to prove the theorems un a 10 machine cluster.

Note that in the exemplary embodiment above, two sets of algebraic systems of polynomials are used when computing the Gröbner bases: $f(x_0, \ldots, x_{n-1})$ and $p(x_0, \ldots, x_{n-1})$.

Exemplary embodiments of the invention apply algebraic geometry method to the problem of verifying circuits defined over Galois fields. To enable use of the exemplary techniques, a suitable description language is used, namely one that is flexible enough to handle detailed circuit optimizations and forces a user to systematically exhibit important aspects of the design to the algebraic geometry machinery. In further exemplary embodiments, the techniques may be extended to state machines (e.g., graphs with loops, a notion of time). In other exemplary embodiments, other UNSAT techniques may be utilized.

FIG. 1 illustrates one exemplary embodiment of the invention using Gröbner bases in conjunction with Buchberger's algorithm. The steps and/or elements of FIG. 1 are described below in detail.

It should be noted that the exemplary flowchart of FIG. 1 may be utilized for practicing the exemplary embodiments of the invention in conjunction with methods, computer programs (e.g., one or more programs of instructions stored on at least one computer-readable medium such as a non-transitory computer-readable medium or a memory, as non-limiting examples) and/or apparatus. These particular exemplary embodiments are described in further detail elsewhere herein. It is further noted that such exemplary embodiments also generally may be referred to as one or more "tools" (e.g., circuit verification tools).

1. The input to the circuit verification tool includes two parts:

(a) The circuit (subject to verification) given by one or more .VHDL files.

(b) The check script containing a description of the expected behavior of the circuit in plain text based algebraic notation.

VHDL stands for very-high-speed integrated circuits (VHSIC) hardware description language and is used in electronic design automation to describe digital and mixed-signal systems. It is a common hardware description language that is used in the art. It should be appreciated that the exemplary embodiments of the invention are not limited to VHDL.

In some exemplary embodiments, the style of the .VHDL input for the tool may be constrained. The following are non-limiting examples of constraints that may be imposed. One or more of these examples may be used in conjunction with others of the examples and/or further constraints.

(i) For all operations involving GF arithmetic, do not use lower level (bit) operations.

(ii) Use operations provided by the library of macro gates for GF arithmetic operations.

For example, do not write:

GF_A[0 . . . 7]<=GF_B[0 . . . 7] xor GF_C[0 . . . 7], and instead use:

GF_A<=GF_ADD_FUNC(GF_B, GF_C).

The names of available GF functions (e.g., GF_ . . . _ FUNCtions) may depend on the macro gates library and, for example, may be contained in a "setup" file. FIG. 2 shows an exemplary setup file that may be used in conjunction with the exemplary embodiments of the invention.

A general library for GF arithmetic operations includes two types of functions. The first type is the basic building blocks for the GF arithmetic ("macro-gates"). Examples of such functions are listed under item 4 below. The second type is comprised of composite functions that use the first type.

A standard hardware description language synthesizer/compiler first splits the second type into instantiations of functions of the first type, and then proceeds to split functions of the first type into elementary boolean logic, which is directly usable for a variety of purposes, including simulation and physical layout, as non-limiting examples.

For various exemplary embodiments of the invention, one can modify a hardware description language synthesizer/compiler so that functions of the first type (macro-gates) are NOT split into elementary boolean logic. A list of macro-gate functions is provided to the verification engine by the check file, and is a subset of the functions described in item 4 below.

Under a standard compiler, macro-gates are not necessarily the leaf nodes of the function dependency tree given by the general GF library (where the parent-child relationship in the tree means that the parent function uses instantiations of the child function in its implementation). As described above, for the purposes of formal verification of the type usable in conjunction with various exemplary embodiments of the invention, it may be desirable to modify the synthesizer/compiler for the high level description language so that it prevents an expansion of the functions specified to be macro-gates.

FIG. 3 depicts an exemplary check script that may be used in conjunction with the exemplary embodiments of the invention. One of ordinary skill in the art will appreciate the meaning of the various terms as well as the notation employed.

2. VHDL compiler (PORTALS/DADB) takes the set of input .VHDL files and produces a macro gate based circuit (a directed graph with a macro gate at each vertex). In some exemplary embodiments, a special feature is added to PORTALS which allows the compilation process to stop at the given cross cut of the function dependency graph (the macro gates level) and not descend into lower level functions.

3. The macro gate based circuit can be considered a set of assignments between signals, each assignment using one of the operations described in item 4.

4. The macro gates are provided to the designer by a fixed library of macro gates. It may include one or more of:

(a) All standard Boolean operations (e.g., AND, OR, NOT, etc.);

(b) Operators from GF to GF (e.g., addition, multiplication, inversion, Frobenius automorphism, projection on a basis vector);

(c) The 'switch' operator from Boolean to GF: GF_a=GF_b when SWITCH_BIT else GF_c; and (d) The algebraic system solvability check operator (from GF to Boolean):

BIT=(is_zero(GF_a) or . . . or is_nonzero(GF_b)) and . . . and (is_nonzero(GF_c) or . . . or is_zero(GF_d)).

5. Each macro gate except for the algebraic system solvability check has at most 33 bit inputs (assuming the order of the field does not exceed $2^{16}$ which is generally or always the case in practice). The algebraic system solvability macro gate .VHDL implementation is trivial because the values of all variables are known. Thus, the correctness of the macro gates implementation can be checked by exhaustive simulation of all possible inputs. In such a manner the library of macro gates is completely verified.

6. The "Settings for checks" script is basically a very simple text description of the expected behavior of the circuit provided by the designer. It has four parts:

Some known values of input bits,

Some known values of input GF elements,

A set of algebraic equalities and inequalities describing the set of legal inputs.

The expected values of some output bits.

(6a) The parser converts this text file into (6b) a set of algebraic systems of polynomials over Galois fields in the C++ library (item 7) internal format.

7. C++ library for manipulations with rational expressions provides a number of functions for arithmetic operations with symbolic rational expressions which, for finite fields, include all linear transforms and Frobenius automorphism. It also provides functions for the output of rational expressions in a nice human readable graphical format.

8. The Buchberger's algorithm block is responsible for the algebraic systems solvability check. The correctness of this part of the program relies on the classical theory of building standard Gröbner bases in a multivariate polynomial ring over a field (see [1]).

The verification process (8) works as follows.

(a) Each input GF signal (except those for which constant values are given in the "settings for checks" file) is assigned a free variable symbol $x_0, x_1, x_2, \ldots$.

(b) As signals propagate through the circuit, each intermediate signal receives a symbolic value that is a rational expression in the free input variables (such as $x_0^2+x_1^2$, $x_2/(x_0+x_1), \ldots$). The C++ library for manipulations with rational expressions block is responsible for conducting the symbolic computations.

(c) Every time an algebraic system solvability check operator is encountered, the Buchberger's algorithm is called to evaluate the truth value of the resulting bit under the algebraic constraints given in the section (c) of the "settings for checks" file.

(d) Compute signals in the circuit symbolically until all output signals for which values are given in section (d) of "settings for checks" are computed. Note that usually it is not necessary to compute all signals to verify the values of the expect bits. For example, if in the "GF_a=GF_b when SWITCH_BIT else GF_c" expression the symbolic expressions for GF_b and GF_c are equivalent, the value of SWITCH_BIT is not needed.

(e) In order to avoid extra computations (e.g., unneeded calls to Buchberger's algorithm) the tool uses a three value Boolean logic feature that allows the bit signals to have one of the three values: FALSE, TRUE, or UNDEFINED. The tool attempts several passes through the circuit, setting the time limit for the calls to Buchberger's algorithm (e.g., 1 sec., 4 sec, 16 sec., etc.). The algorithm stops as soon as all signals needed for the "expect" bits computation receive some defined values.

(f) Verify the output bits values against the given expected values.

9. (a) If all the expected bit values match the expectations, then the circuit is formally proved to work correctly for all possible legal combinations of inputs. In that case, a brief "test passed" message may be displayed (e.g., report pass/fail) and (b) the formal prove is dumped into a human readable postscript file (e.g., log file).

10. If the proof fails, the program reports so and goes into a bug tracing mode. A simple user interface allows a user to browse the graph of signals showing their symbolic values in terms of the inputs and allowing one to trace the origin of each signal through the hierarchy of the .VHDL files.

11. The verifier can verify only flat circuits (without latches). However, if the circuit does not have a very complicated latch structure (e.g., pipeline) it can be flattened, verified with the verifier, and then the flattened version can be verified against the version with latches.

FIG. 1 and the above description thereof illustrates one non-limiting, exemplary implementation of the invention (e.g., one useful for verifying Reed-Solomon codes based error correcting circuits). The exemplary embodiments of the invention are not limited solely to the exemplary implementation of FIG. 1. Below is a more general description of various exemplary embodiments of the invention.

The subject to verification is a circuit represented using GF signals. In some exemplary embodiments, the circuit has a large share of GF (multi-bit) signals and only a few other bits (e.g., control bit signals). In further exemplary embodiments, efficiency of the process improves with a greater percentage or portion of the circuit having GF signals (e.g., greater than 80%, greater than 90%, greater than 95%, though lower percentages are also contemplated). It should be noted that the exemplary methods and techniques described herein function correctly regardless of the percentage or portion of the circuit having GF signals.

The result of verification is a symbolic proof of correctness of the circuit against a simple algebraic description of the expected behavior of the circuit. In some exemplary embodiments, this algebraic description may be based on the art in question. For example, if the circuit is for error correctic codes, the algebraic description may be from or at least partially based on references (e.g., books) that consider such ECC circuits. As further non-limiting examples, the circuit in question may concern encryption or other areas of applied mathematics. In some exemplary embodiments, the algebraic description may be based on a customized description of the particular circuit.

The verification is made by formal reasoning and thus provides a proof of correctness of the output for any possible input (e.g., as opposed to random sampling methods).

In some exemplary embodiments, the circuit may be based on the four major types of operations:

(a) GF→GF (e.g., the field arithmetic, automorphisms and linear transforms).

(b) GF→boolean (e.g., test if x=0 or test if algebraic system $S_1$ implies algebraic system $S_2$).

(c) boolean→GF (e.g., GF-MUX: x=y when bit else z).

(d) Primitive bit operations (e.g., not, or, and, xor).

In order to produce the formal proof of correctness, rational expressions are propagated over GF through the circuit. The GF inputs are assigned free variable symbols (e.g., $x_1$, $x_2$, ...). If there are some bit inputs, then the verification process forks on each such bit. As such, in some exemplary embodiments only a few input bit (non-GF) signals are allowed/permitted.

On operations (macro-gates) of the types (a), (b), (c), (d) (see above), the following actions are taken:

(a) A new symbolic rational expression in the free variables is computed according to the GF→GF operation. Here it is important that automorphisms of finite fields and linear transforms are rational expressions of their argument (so called linearized polynomials, see [2] pp. 107-124).

(b) All Boolean checks with GF arguments reduce to a problem of satisfiability of some system of algebraic equations over a GF. The satisfiability of an algebraic system can be checked by building Gröbner bases of the ideal generated by the system (Buchberger's algorithm [1], pp. 77, 82-87). If the result of the check can be proved to be TRUE or FALSE in a given time limit (the common case), the corresponding bit receives a constant value '1' or '0'. Otherwise the bit value is set to 'UNDEFINED' and the propagation of other signals continues. If the symbolic propagation does not complete without the skipped bit value, the time limit for the Buchberger's algorithm increases and more attempts to compute the bit value are made. If the maximum time limit computation does not yield '0' or '1' (a relatively rare case), the process forks on this bit value and the two branches continue under bit='0' and bit='1' assumptions. By computing the Gröbner bases of the system prior to forking, forking can be avoided in the majority of situations.

(c) Because of (b), each bit either has a constant value or is 'UNDEFINED' due to Buchberger's algorithm timeout. In the first case, the value of GF-MUX is one of its GF arguments (a rational expression). In the second case, the GF value computation is postponed until Buchberger's algorithm time limit increases or forking occurs.

(d) Because of (b), each bit either has a constant value or is 'UNDEFINED' due to Buchberger's algorithm timeout or forking. As a non-limiting example, the decision between retrying with a bigger time limit or forking may be made based on the time limit given in the setup file. Three value logic is used to propagate such values under NOT, OR, AND and/or XOR operations.

After all signals are symbolically propagated, the outputs are checked against their expected symbolic form. Alternatively, an additional .VHDL check file can be introduced to check certain expected relationships between outputs. For example, in order to check that out_ x=0 ⇒ out_y$^2$+out_z$^2$=out_t, use a small .VHDL file that sets out_bit to the Boolean value of NOT(out_x=0 & out_y$^2$+out_z$^2$≠out_t) and check that out_bit=TRUE.

In this general formulation, the exemplary embodiments of the invention have a number of applications including, but not limited to:

1. Verification of finite field based error correcting codes (e.g., BCH codes, Reed-Solomon codes, classical and geometric Goppa codes).
2. Verification of implementations of Advanced Encryption Standard algorithm. AES is based on GF(256) arithmetic. Verification of implementation of one round of AES is especially simple because no bit signals are involved. Verification of multiple rounds is more difficult because of the exponentially growing size of the rational expressions.
3. Verification of any kind of arithmetic logic units involving finite field operations or operations in the ring Z/nZ.
4. Design of new ECC, encryption and other schemes. One of the advantages of the verifier is its ability to check/proof statements about an incomplete design or parts of a design (e.g., as opposed to simulation methods that require the final output values to be computed and compared to the expected values).
5. The tool can be used as a subroutine of a bigger program that searches for good set parameters for an encryption or ECC scheme which must have some algebraic properties as defined by the designer.

REFERENCES

[1] David Cox and John Little and Donald O'Shea. *Ideals, Varieties and Algorithms of Undergraduate Texts in Mathematics*. Springer, 2010. ISBN: 0-387-35650-9.

[2] Rudolf Lidl and Harald Niederreiter. *Finite Fields of Encyclopedia of Mathematics and Its Applications*, Volume 20. Cambridge University Press, 1997. ISBN: 0-521-39231-4.

The exemplary embodiments of the invention facilitate various aspects and/or constructions based on the above descriptions. For example, the exemplary embodiments of the invention enable production of an automated tool that generates and/or produces tests and/or test results based on certain inputs (e.g., certain formatted inputs). As another example, the exemplary embodiments of the invention enable construction and usage of multiple (e.g., a plurality of) engines operating in parallel. That is, one may use the above exemplary teachings to parallelize the circuit analysis by operating/running multiple engines in parallel (e.g., each receiving the same input(s)) to subdivide the work and obtain results in a more timely manner. The results from the individual engines may be combined to obtain a final, overall result for the circuit.

The exemplary embodiments of the invention utilize formal reasoning at the GF level instead of only Boolean. The exemplary embodiments of the invention use computational algebraic geometry to construct a more efficient analysis engine for evaluating circuits. Furthermore, the exemplary embodiments of the invention may be used with correct by construction design such that one is assured that the ultimate product has been fully tested and considered and was found to be bug-free. In addition, the exemplary embodiments of the invention provide improvements for circuit verification such as reduced running time (e.g., speeding up the process) and/or the ability to verify circuits that might otherwise not be capable of verification using conventional tools (e.g., due to the number of inputs, due to circuit complexity), as non-limiting examples.

While described above primarily in reference to checking satisfiability of algebraic systems over finite fields by building Gröbner bases, it should be appreciated that other suitable techniques may also be used, such as reduction to solving a linear system derived from the effective Nullstellensatz, as a non-limiting example. One alternative to "Buchberger's algorithm" (e.g., as described above) is the "Slim Gröbner basis method." This technique is also based on the Buchberger's algorithm, but, generally speaking, is more sophisticated. Another example is Faugere's F4 algorithm, also based on similar mathematics as Buchberger's algorithm.

Figure 4:
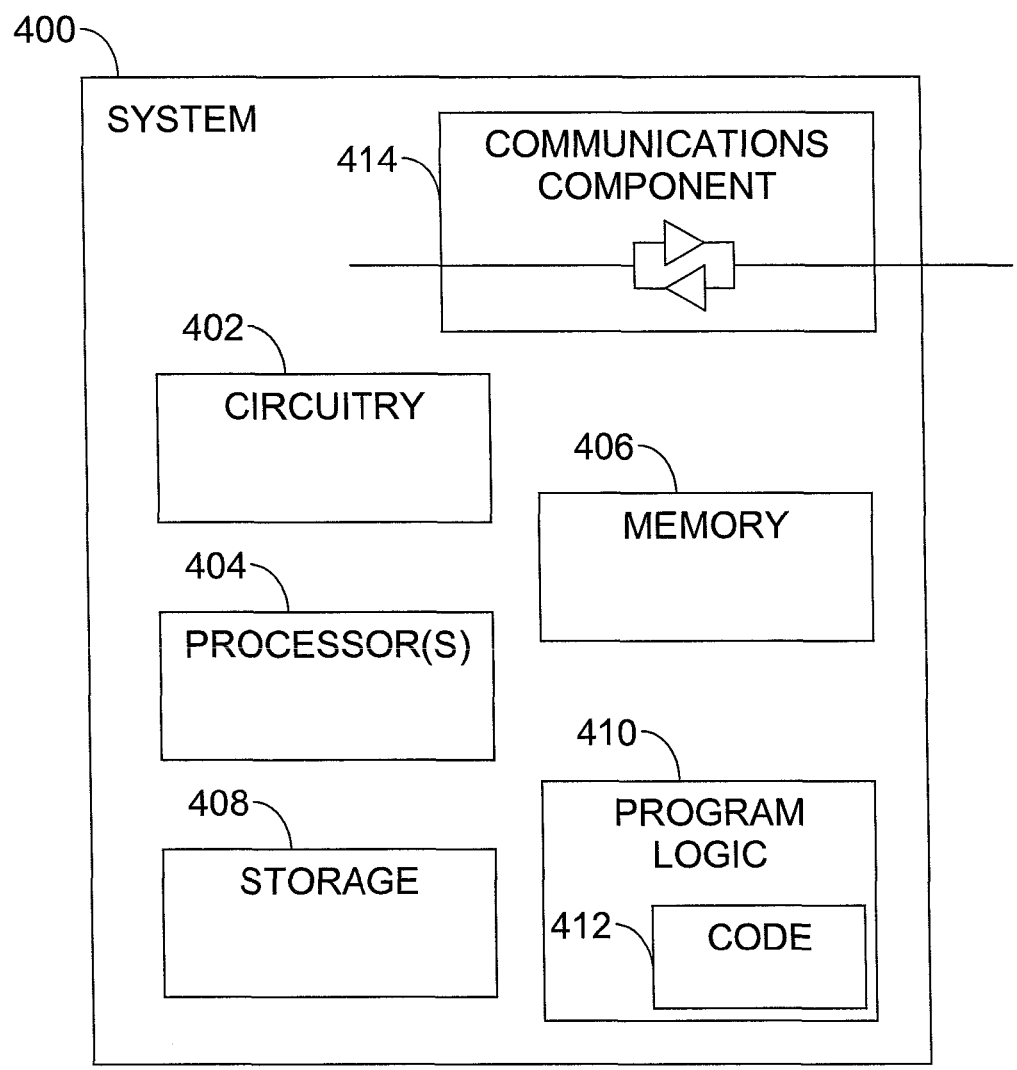
FIG. 4 illustrates a block diagram of an exemplary system in which various exemplary embodiments of the invention may be implemented.

FIG. 4 illustrates a block diagram of an exemplary system 400 in which various exemplary embodiments of the invention may be implemented. The system 400 may include at least one memory 406 (e.g., a volatile memory device, a non-volatile memory device) and/or at least one storage 408. The system 400 may also include at least one circuitry 402 (e.g., circuitry element, circuitry components, integrated circuit) that may in certain exemplary embodiments include at least one processor 404 and/or form a component of the at least one memory 406 (e.g., one or more registers, buffers, hub devices, and/or non-volatile storage). The storage 408 may include a non-volatile memory device (e.g., erasable programmable read only memory (EPROM), electrically erasable programmable read-only memory (EEPROM), read-only memory (ROM), programmable read-only memory (PROM), random access memory (RAM), dynamic random access memory (DRAM), synchronous dynamic random access memory (SDRAM), static random access memory (SRAM), flash, firmware, programmable logic, etc.), magnetic disk drive, optical disk drive and/or tape drive, as non-limiting examples. The storage 408 may comprise an internal storage device, an attached storage device and/or a network accessible storage device, as non-limiting examples. The system 400 may include at least one program logic 410 including code 412 (e.g., program code, a computer program, program instructions) that may be loaded into the memory 406 and executed by the processor 404 and/or circuitry 402. In certain exemplary embodiments, the program logic 410, including code 412, may be stored in the storage 408. In certain other exemplary embodiments, the program logic 410 may be implemented in the circuitry 402. Therefore, while FIG. 4 shows the program logic 410 separately from the other elements, the program logic 410 may be implemented and/or stored in the memory 406 and/or the circuitry 402, as non-limiting examples.

The system 400 may include at least one communications component 414 that enables communication with at least one other component, system, device and/or apparatus. As non-limiting examples, the communications component 414 may include a transceiver configured to send and receive information, a transmitter configured to send information and/or a receiver configured to receive information. As a non-limiting example, the communications component 414 may comprise a modem and/or network card. The system 400 of FIG. 4 may be embodied in a computer and/or computer system, such as a desktop computer, a portable computer or a server, as non-limiting examples. The components of the system 400 shown in FIG. 4 may be connected or coupled together using one or more internal buses, connections, wires and/or (printed) circuit boards, as non-limiting examples.

It should be noted that in accordance with the exemplary embodiments of the invention, one or more of the circuitry 402, processor(s) 404, memory 406, storage 408, program logic 410 and/or communications component 414 may store one or more of the various items (e.g., data, databases, tables, items, vectors, matrices, variables, equations, formula, operations, operational logic, logic) discussed herein. As a non-limiting example, one or more of the above-identified components may receive and/or store the data, information, parity information and/or instructions/operations/commands. As a further non-limiting example, one or more of the above-identified components may receive and/or store the function(s), operations, functional components and/or operational components, as described herein.

The exemplary embodiments of this invention may be carried out by computer software implemented by the processor 404 or by hardware, or by a combination of hardware and software. As a non-limiting example, the exemplary embodiments of this invention may be implemented by one or more integrated circuits. The memory 406 may be of any type appropriate to the technical environment and may be implemented using any appropriate data storage technology, such as optical memory devices, magnetic memory devices, semiconductor-based memory devices, fixed memory and removable memory, as non-limiting examples. The processor 404 may be of any type appropriate to the technical environment, and may encompass one or more of microprocessors, general purpose computers, special purpose computers and processors based on a multi-core architecture, as non-limiting examples.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 5:
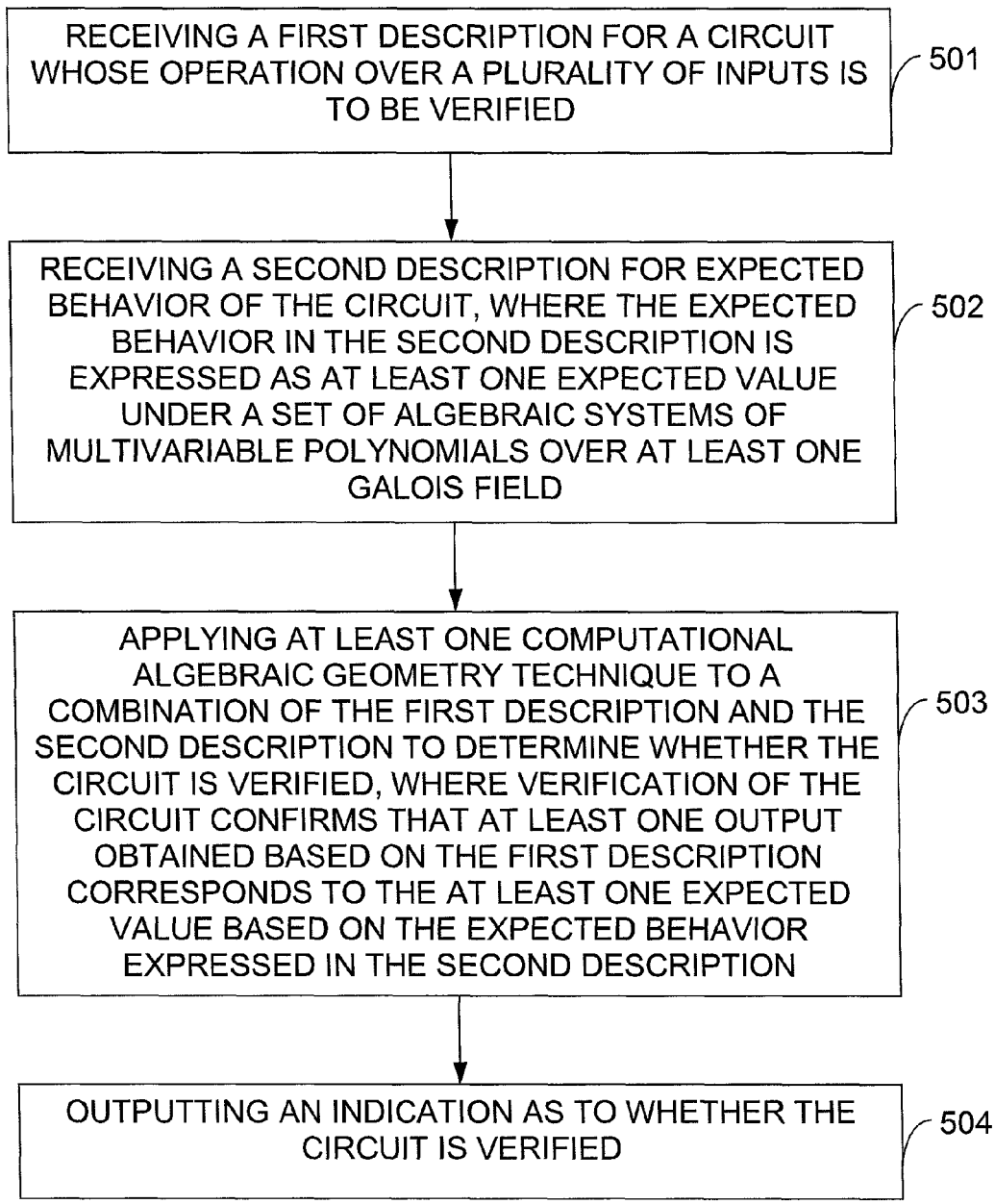
FIG. 5 depicts a flowchart illustrating a non-limiting example of a method for practicing the exemplary embodiments of the invention.

(1) In one exemplary embodiment of the invention, and as illustrated in FIG. 5, a method comprising: receiving (e.g., by an apparatus, by a processor) a first description for a circuit whose operation over a plurality of inputs is to be verified (501); receiving (e.g., by the apparatus) a second description for expected behavior of the circuit, where the expected behavior in the second description is expressed as at least one expected value under a set of algebraic systems of multivariable polynomials over at least one Galois field (502); applying (e.g., by the apparatus) at least one computational algebraic geometry technique to a combination of the first description and the second description to determine whether the circuit is verified, where verification of the circuit confirms that at least one output obtained based on the first description corresponds to the at least one expected value based on the expected behavior expressed in the second description (503); and outputting (e.g., by the apparatus, by the processor) an indication as to whether the circuit is verified (504).

A method as above, where applying the at least one computational algebraic geometry technique comprises at least one of: computing Gröbner bases for the set of algebraic systems of polynomials; and computing Gröbner bases for the set of algebraic systems of polynomials with another set of algebraic systems obtained by analyzing the circuit. A method as in any above, where applying the at least one computational algebraic geometry technique further comprises using Buchberger's algorithm to evaluate the computed Gröbner bases. A method as in any above, where applying the at least one computational algebraic geometry technique further comprises using three value Boolean logic such that bit signals have one of three values, where the three values consist of TRUE, FALSE and UNDEFINED. A method as in any above, where the first description comprises a set of macro gates with each macro gate representing a Galois field operation, a Boolean operation, a Galois field-to-Boolean operation or a Boolean-to-Galois field operation. A method as in any above, where the second description comprises at least one of: a plurality of known first values for at least a portion of the plurality of inputs, a plurality of known second values for a plurality of input Galois field elements, a set of algebraic equalities and inequalities describing a set of legal inputs, the at least one expected value, and the at least one expected value for at least a portion of the at least one output from the circuit. A method as in any above, wherein the first description is obtained by a hardware description language compiler that prevents expansion of macro-gates into their Boolean logic representation.

A method as in any above, where applying the at least one computational algebraic geometry technique further comprises, in response to encountering a Boolean satisfiability that cannot be resolved, forking to at least two branches that continue independently based on at least two different assumptions. A method as in any above, where the at least two branches consist of a first branch based on a first assumption and a second branch based on a second assumption, where the first assumption is "satisfiability is true" and the second assumption is "satisfiability is false." A method as in any above, where the at least two branches consist of a first branch based on a first assumption and a second branch based on a second assumption, where the first assumption is "Boolean signal is true" and the second assumption is "Boolean signal is false." A method as in any above, further comprising: in response to the circuit not being combinatorially flat, reducing to a flat case by symbolic simulation of the circuit. A method as in any above, where the circuit not being combinatorially flat is due to at least one of: the circuit comprising at least one latch, and the circuit comprising a state machine. A method as in any above, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one expected value is for at least one signal in the circuit.

A computer-readable storage medium tangibly embodying a program of instructions executable by a machine for performing operations comprising any one of the above-described methods. A method as in any above, implemented as a computer program. A method as in any above, implemented as a program of instructions stored (e.g., tangibly embodied) on a program storage device (e.g., at least one memory, at least one computer-readable medium) and executable by a computer (e.g., at least one processor). A method as in any above, further comprising one or more aspects of the exemplary embodiments of the invention as described further herein.

(2) In another exemplary embodiment of the invention, and as illustrated in FIG. 5, a computer-readable storage medium (e.g., non-transitory) tangibly embodying (e.g., storing) a program of instructions (e.g., a computer program, computer program instructions) executable by a machine (e.g., at least one processor, at least one computer) for performing operations, the operations comprising: receiving a first description for a circuit whose operation over a plurality of inputs is to be verified (501); receiving a second description for expected behavior of the circuit, where the expected behavior in the second description is expressed as at least one expected value under a set of algebraic systems of multivariable polynomials over at least one Galois field (502); applying at least one computational algebraic geometry technique to a combination of the first description and the second description to determine whether the circuit is verified, where verification of the circuit confirms that at least one output obtained based on the first description corresponds to at least one expected value based on the expected behavior expressed in the second description (503); and outputting an indication as to whether the circuit is verified (504).

A computer readable storage medium as in any above, where the computer readable storage medium comprises a at least one memory or at least one program storage device. A computer readable storage medium as in any above, where the machine comprises a computer or at least one processor configured to execute the program of instructions. A computer readable storage medium as in any above, further comprising one or more aspects of the exemplary embodiments of the invention as described further herein.

(3) In a further exemplary embodiment of the invention, an apparatus comprising: at least one processor; and at least one memory configured to store computer program instructions, execution of the computer program instructions by the at least one processor resulting in operations comprising: receiving a first description for a circuit whose operation over a plurality of inputs is to be verified; receiving a second description for expected behavior of the circuit, where the expected behavior in the second description is expressed as at least one expected value under a set of algebraic systems of multivariable polynomials over at least one Galois field; applying at least one computational algebraic geometry technique to a combination of the first description and the second description to determine whether the circuit is verified, where verification of the circuit confirms that at least one output obtained based on the first description corresponds to at least one expected value based on the expected behavior expressed in the second description; and outputting an indication as to whether the circuit is verified.

An apparatus as in any above, embodied as one or more integrated circuits. An apparatus as in any above, further comprising one or more aspects of the exemplary embodiments of the invention as described herein.

(4) In another exemplary embodiment of the invention, an apparatus comprising: means for receiving (e.g., at least one input, at least one storage device, at least one memory, at least one processor) a first description for a circuit whose operation over a plurality of inputs is to be verified; means for receiving (e.g., at least one input, at least one storage device, at least one memory, at least one processor) a second description for expected behavior of the circuit, where the expected behavior in the second description is expressed as at least one expected value under a set of algebraic systems of multivariable polynomials over at least one Galois field; means for applying (e.g., at least one processor, at least one processing component, at least one processing block, at least one integrated circuit) at least one computational algebraic geometry technique to a combination of the first description and the second description to determine whether the circuit is verified, where verification of the circuit confirms that at least one output obtained based on the first description corresponds to at least one expected value based on the expected behavior expressed in the second description; and means for outputting (e.g., at least one output, at least one storage device, at least one user interface, at least one communication component, at least one modem, at least one transmitter, at least one memory, at least one processor) an indication (e.g., confirmation, rejection, report, graphical element, graphical element on a user interface, at least one file) as to whether the circuit is verified.

An apparatus as in any above, embodied as one or more integrated circuits. An apparatus as in any above, further comprising one or more aspects of the exemplary embodiments of the invention as described herein.

(5) In a further exemplary embodiment of the invention, an apparatus comprising: first reception circuitry configured to receive a first description for a circuit whose operation over a plurality of inputs is to be verified; second reception circuitry configured to receive a second description for expected behavior of the circuit, where the expected behavior in the second description is expressed as at least one expected value under a set of algebraic systems of multivariable polynomials over at least one Galois field; processing circuitry configured to apply at least one computational algebraic geometry technique to a combination of the first description and the second description to determine whether the circuit is verified, where verification of the circuit confirms that at least one output obtained based on the first description corresponds to at least one expected value based on the expected behavior expressed in the second description; and output circuitry configured to output an indication (e.g., confirmation, rejection, report, graphical element, graphical element on a user interface, at least one file) as to whether the circuit is verified.

An apparatus as in any above, embodied as one or more integrated circuits. An apparatus as in any above, further comprising one or more aspects of the exemplary embodiments of the invention as described herein.

(6) In one exemplary embodiment of the invention, and as illustrated in FIG. 6, a method comprising: receiving (e.g., by an apparatus) at least one electronic file comprising a first description for expected behavior of a circuit whose operation over a plurality of inputs is to be verified, where the expected behavior in the first description is expressed as at least one expected value under a set of algebraic systems of multivariable polynomials, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit (601); and determining (e.g., by the apparatus) whether the circuit is verified by using the first description from the at least one electronic file and a second description, where the second description comprises a description of the circuit, where verification of the circuit confirms that at least one output obtained based on the second description corresponds to the at least one expected value expressed in the first description (602).

A method as above, where determining whether the circuit is verified comprises applying at least one computational algebraic geometry technique to a combination of the first description and the second description. A method as in any above, where applying the at least one computational algebraic geometry technique comprises at least one of: computing Gröbner bases for the set of algebraic systems of polynomials; and computing Gröbner bases for the set of algebraic systems of polynomials with another set of algebraic systems obtained by analyzing the circuit. A method as in any above, where applying the at least one computational algebraic geometry technique further comprises using Buchberger's algorithm to evaluate the computed Gröbner bases. A method as in any above, where applying the at least one computational algebraic geometry technique further comprises using three value Boolean logic such that bit signals have one of three values, where the three values consist of TRUE, FALSE and UNDEFINED. A method as in any above, where the second description comprises a set of macro gates with each macro gate representing a Galois field operation, a Boolean operation, a Galois field-to-Boolean operation or a Boolean-to-Galois field operation. A method as in any above, where the first description comprises at least one of: a plurality of known first values for at least a portion of the plurality of inputs, a plurality of known second values for a plurality of input Galois field elements, a set of algebraic equalities and inequalities describing a set of legal inputs, and the at least one expected value for at least a portion of the at least one output from the circuit. A method as in any above, wherein the second description is obtained by a hardware description language compiler that prevents expansion of macro-gates into their Boolean logic representation.

A method as in any above, where applying the at least one computational algebraic geometry technique further comprises, in response to encountering a Boolean satisfiability that cannot be resolved, forking to at least two branches that continue independently based on at least two different assumptions. A method as in any above, where the at least two branches consist of a first branch based on a first assumption and a second branch based on a second assumption, where the first assumption is "satisfiability is true" and the second assumption is "satisfiability is false." A method as in any above, where the at least two branches consist of a first branch based on a first assumption and a second branch based on a second assumption, where the first assumption is "Boolean signal is true" and the second assumption is "Boolean signal is false." A method as in any above, further comprising: in response to the circuit not being combinatorially flat, reducing to a flat case by symbolic simulation of the circuit. A method as in any above, where the circuit not being combinatorially flat is due to at least one of: the circuit comprising at least one latch, and the circuit comprising a state machine.

A computer-readable storage medium tangibly embodying a program of instructions executable by a machine for performing operations comprising any one of the above-described methods. A method as in any above, implemented as a computer program. A method as in any above, implemented as a program of instructions stored (e.g., tangibly embodied) on a program storage device (e.g., at least one memory, at least one computer-readable medium) and executable by a computer (e.g., at least one processor). A method as in any above, further comprising one or more aspects of the exemplary embodiments of the invention as described further herein.

(7) In another exemplary embodiment of the invention, and as illustrated in FIG. 6, a computer-readable storage medium (e.g., non-transitory) tangibly embodying (e.g., storing) a program of instructions (e.g., a computer program, computer program instructions) executable by a machine (e.g., at least one processor, at least one computer) for performing operations, the operations comprising: receiving at least one electronic file comprising a first description for expected behavior of a circuit whose operation over a plurality of inputs is to be verified, where the expected behavior in the first description is expressed as at least one expected value under a set of algebraic systems of multivariable polynomials, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit (601); and determining whether the circuit is verified by using the first description from the at least one electronic file and a second description, where the second description comprises a description of the circuit, where verification of the circuit confirms that at least one output obtained based on the second description corresponds to the at least one expected value expressed in the first description (602).

A computer readable storage medium as in any above, where the computer readable storage medium comprises a at least one memory or at least one program storage device. A computer readable storage medium as in any above, where the machine comprises a computer or at least one processor configured to execute the program of instructions. A computer readable storage medium as in any above, further comprising one or more aspects of the exemplary embodiments of the invention as described further herein.

(8) In a further exemplary embodiment of the invention, an apparatus comprising: at least one processor; and at least one memory configured to store computer program instructions, execution of the computer program instructions by the at least one processor resulting in operations comprising: receiving at least one electronic file comprising a first description for expected behavior of a circuit whose operation over a plurality of inputs is to be verified, where the first description comprises an algebraic system of multivariable polynomials, where the algebraic system comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and determining whether the circuit is verified by using the first description from the at least one electronic file and a second description, where the second description comprises a description of the circuit, where verification of the circuit confirms that at least one output obtained based on the second description corresponds to the at least one expected value expressed in the first description.

An apparatus as in any above, embodied as one or more integrated circuits. An apparatus as in any above, further comprising one or more aspects of the exemplary embodiments of the invention as described herein.

(9) In another exemplary embodiment of the invention, an apparatus comprising: means for receiving (e.g., at least one input, at least one storage device, at least one memory, at least one processor) at least one electronic file comprising a first description for expected behavior of a circuit whose operation over a plurality of inputs is to be verified, where the first description comprises an algebraic system of multivariable polynomials, where the algebraic system comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and means for determining (e.g., at least one processor, at least one processing component, at least one processing block, at least one integrated circuit) whether the circuit is verified by using the first description from the at least one electronic file and a second description, where the second description comprises a description of the circuit, where verification of the circuit confirms that at least one output obtained based on the second description corresponds to the at least one expected value expressed in the first description.

An apparatus as above, further comprising: means for outputting (e.g., at least one output, at least one storage device, at least one user interface, at least one communication component, at least one modem, at least one transmitter, at least one memory, at least one processor) an indication (e.g., confirmation, rejection, report, graphical element, graphical element on a user interface, at least one file) as to whether the circuit is verified. An apparatus as in any above, embodied as one or more integrated circuits. An apparatus as in any above, further comprising one or more aspects of the exemplary embodiments of the invention as described herein.

(10) In a further exemplary embodiment of the invention, an apparatus comprising: reception circuitry configured to receive at least one electronic file comprising a first description for expected behavior of a circuit whose operation over a plurality of inputs is to be verified, where the first description comprises an algebraic system of multivariable polynomials, where the algebraic system comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and determination circuitry configured to determine whether the circuit is verified by using the first description from the at least one electronic file and a second description, where the second description comprises a description of the circuit, where verification of the circuit confirms that at least one output obtained based on the second description corresponds to the at least one expected value expressed in the first description.

An apparatus as in any above, embodied as one or more integrated circuits. An apparatus as in any above, further comprising one or more aspects of the exemplary embodiments of the invention as described herein.

The exemplary embodiments of the invention, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise steps of utilizing the exemplary embodiments or steps of the method.

The blocks shown in FIGS. 5 and 6 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 5 and 6 should be considered merely exemplary and non-limiting. It should be appreciated that the blocks shown in FIGS. 5 and 6 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 5 and 6 so as to implement one or more further exemplary embodiments of the invention.

That is, the exemplary embodiments of the invention shown in FIGS. 5 and 6 may be utilized, implemented or practiced in conjunction with one or more further aspects in any combination (e.g., any combination that is suitable, practicable and/or feasible) and are not limited only to the steps, blocks, operations and/or functions shown in FIGS. 5 and 6.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
   receiving, by using a computer, a first description for a circuit whose operation over a plurality of inputs is to be verified;
   receiving, by using the computer, a second description for expected behavior of the circuit, where the expected behavior in the second description is expressed as at least one expected value under a set of algebraic systems of multivariable polynomials over at least one Galois field;
   applying at least one computational algebraic geometry technique to a combination of the first description and the second description;
   adjusting a time limit for the at least one computational algebraic geometry technique to increase a number of attempts of the at least one computational algebraic geometry technique to determine whether the circuit is verified,
   confirming that at least one output obtained based on the first description corresponds to at least one expected value based on the expected behavior expressed in the second description;
   outputting, by using the computer, an indication as to whether the circuit is verified; and where applying the at least one computational algebraic geometry technique further comprises, in response to encountering a Boolean satisfiability that cannot be resolved, forking to at least two branches that continue independently based on at least two different assumptions.

2. The method of claim 1, where applying the at least one computational algebraic geometry technique comprises at least one of: computing Gröbner bases for the set of algebraic systems of polynomials; and computing Gröbner bases for the set of algebraic systems of polynomials with another set of algebraic systems obtained by analyzing the circuit.

3. The method of claim 2, where applying the at least one computational algebraic geometry technique further comprises using Buchberger's algorithm to evaluate the computed Gröbner bases.

4. The method of claim 3, where applying the at least one computational algebraic geometry technique further comprises using three value Boolean logic such that bit signals have one of three values, where the three values consist of TRUE, FALSE and UNDEFINED.

5. The method claim 1, where the first description comprises a set of macro gates with each macro gate representing a Galois field operation, Boolean operation, a Galois field-to-Boolean operation or a Boolean-to-Galois field operation.

6. The method claim 5, wherein the first description is obtained by a hardware description language compiler that prevents expansion macro-gates into their Boolean logic representation.

7. The method of claim 1, where the second description comprises at least one of: a plurality of known first values for at least a portion of the plurality of inputs, a plurality of known second values for a plurality of input Galois field elements, a set of algebraic equalities and inequalities describing a set of legal inputs, the at least one expected value, and the at least one expected value for at least a portion of the at least one output from the circuit.

8. The method of claim 1, where the at least two branches consist of a first branch based on a first assumption and a second branch based on a second assumption, where the first assumption is "satisfiability is true" and the second assumption is "satisfiability is false."

9. The method of claim 1, where the at least two branches consist of a first branch based on a first assumption and a second branch based on a second assumption, where the first assumption is "Boolean signal is true" and the second assumption is "Boolean signal is false."

10. The method of claim 1, further comprising:
in response to the circuit not being combinatorially flat, reducing to a flat case by symbolic simulation of the circuit.

11. The method of claim 1, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one expected value is for at least one signal in the circuit.

12. A computer-readable storage medium tangibly embodying a program of instructions executable by a machine for performing operations comprising the method of claim 1.

13. An apparatus comprising:
at least one processor; and
at least one memory configured to store computer program instructions, execution of the computer program instructions by the at least one processor resulting in operations comprising:
receiving a first description for a circuit whose operation over a plurality of inputs is to be verified;
receiving a second description for expected behavior of the circuit, where the expected behavior in the second description is expressed as a set of algebraic systems of multivariable polynomials over at least one Galois field;
applying at least one computational algebraic geometry technique to a combination of the first description and the second description;
adjusting a time limit for the at least one computational algebraic geometry technique to increase a number of attempts of the at least one computational algebraic geometry technique to determine whether the circuit is verified;
confirming that at least one output obtained based on the first description corresponds to at least one expected value based on the expected behavior expressed in the second description;
outputting an indication as to whether the circuit is verified; and
where applying the at least one computational algebraic geometry technique further comprises, in response to encountering a Boolean satisfiability that cannot be resolved, forking to at least two branches that continue independently based on at least two different assumptions.

14. The apparatus of claim 13, where applying the at least one computational algebraic geometry technique comprises at least one of: computing Gröbner bases for the set of algebraic systems of polynomials; and computing Gröbner bases for the set algebraic systems of polynomials with another set of algebraic systems obtain by analyzing the circuit.

15. The apparatus of claim 14, where applying the at least one computational algebraic geometry technique further comprises using Buchberger's algorithm to evaluate the computed Gröbner bases.

16. A method comprising:
receiving, by using a computer, at least one electronic file comprising a first description for expected behavior of a circuit whose operation over a plurality of inputs is to be verified, where the expected behavior in the first description is expressed as at least one expected value under a set of algebraic systems of multivariable polynomials, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and
determining whether the circuit is verified by using the first description from the at least one electronic file and a second description, where the second description comprises a description of the circuit, by applying at least one computational algebraic geometry technique to a combination of the first description and the second description, where verification of the circuit confirms that at least one output obtained based on the second description corresponds to the least expected value expressed in the first description, where the verification the circuit includes adjusting a time limit for using the first description from the at least one electronic file and the second description, and where applying the at least one computational algebraic geometry technique further comprises, in response to encountering a Boolean satisfiability that cannot be resolved, forking to at least two branches that continue independently based on at least two different assumptions.

17. The method of claim 16, where applying the at least one computational algebraic geometry technique comprises at least one of: computing Gröbner bases for the set of algebraic systems of polynomials; and computing Gröbner bases for the set of algebraic systems of polynomials with another set of algebraic systems obtained by analyzing the circuit.

18. The method of claim 17, where applying the at least one computational algebraic geometry technique further comprises using Buchberger's algorithm to evaluate the computed Gröbner bases.

19. A computer-readable storage medium tangibly embodying a program of instructions executable by a machine for performing operations comprising the method of claim 16.

20. An apparatus comprising:
at least one processor; and
at least one memory configured store computer program instructions, execution of the comp program instructions by the least one process resulting in operations comprising:
receiving at least one electronic file comprising a first description for expected behavior of a circuit whose operation over a plurality of inputs is to be verified, where the expected behavior in the first description is expressed as at least one expected value under a set of algebraic systems of multivariable polynomials, where the set of algebraic systems comprises at least one of a first equation and a second equation, where the first equation is in at least one first variable over at least one first Galois field and is set equal to zero, where the second equation is in at least one second variable over at least one second Galois field and is set not equal to zero, where the at least one electronic file further comprises at least one expected value of at least one signal in the circuit; and determining whether the circuit is verified by using the first description from the at least one electronic file and a second description, where the second description comprises a description of the circuit, where determining whether the circuit is verified comprises applying at least one computational algebraic geometry technique to a combination of the first description and the second description, where verification of the circuit confirms that at least one output obtained based on the second description corresponds to the at least one expected value expressed in the first description, where the verification the circuit includes adjusting a time limit for using the first description from the at least one electronic file and the second description, and where applying the at least one computational algebraic geometry technique further comprises, in response to encountering a Boolean satisfiability that cannot be resolved, forking to at least two branches that continue independently based on at least two different assumptions.

21. The apparatus of claim 20, where applying the at least one computational algebraic geometry technique comprises at least one of: computing Gröbner bases for the set of algebraic systems of polynomials; and computing Gröbner bases for the set of algebraic systems of polynomials with another set of algebraic systems obtained by analyzing the circuit.

22. The apparatus of claim 21, where applying the at least one computational algebraic geometry technique further comprises using Buchberger's algorithm to evaluate the computed Gröbner bases.

* * * * *